(12) United States Patent
Hansen

(10) Patent No.: US 6,693,701 B2
(45) Date of Patent: Feb. 17, 2004

(54) METHOD AND APPARATUS FOR DIFFRACTIVE TRANSFER OF A MASK GRATING

(75) Inventor: Poul-Erik Hansen, Farum (DK)

(73) Assignee: Ibsen Photonics A/S, Farum (DK)

( * ) Notice: Subject to any disclaimer, the term of this patent is extended or adjusted under 35 U.S.C. 154(b) by 0 days.

(21) Appl. No.: 09/867,036

(22) Filed: May 29, 2001

(65) Prior Publication Data
US 2002/0180941 A1 Dec. 5, 2002

(51) Int. Cl.[7] ................................................ G03B 27/42
(52) U.S. Cl. ................................................ 355/53; 355/77
(58) Field of Search ............................. 355/53, 52, 72, 355/77, 75, 30, 55

(56) References Cited

U.S. PATENT DOCUMENTS

| | | | |
|---|---|---|---|
| 5,087,538 A | | 2/1992 | Nelson |
| 5,327,515 A | * | 7/1994 | Anderson et al. ........... 359/566 |
| 5,476,736 A | | 12/1995 | Tanabe |
| 5,503,959 A | * | 4/1996 | Langston ................. 250/492.2 |
| 5,760,960 A | * | 6/1998 | Lin et al. ........................ 359/34 |
| 6,269,208 B1 | * | 7/2001 | Bhatia et al. ................ 359/559 |
| 6,347,171 B1 | * | 2/2002 | Tatah et al. .................. 359/563 |

FOREIGN PATENT DOCUMENTS

GB    2 333 849    8/1999

* cited by examiner

Primary Examiner—Russell Adams
Assistant Examiner—D. Ben Esplin
(74) Attorney, Agent, or Firm—Altera Law Group, LLC

(57) ABSTRACT

An improved technique of exposing a photoresist through a grating mask reduces the occurrence of overlapping gratings and also avoids distortions in the exposed mask when there is a gap between the contact mask and the photoresist layer. The technique is particularly well suited to forming Bragg gratings on semiconductors and other materials that are used for wavelength selection in, for example, optical communications applications. The technique employs a phase grating held close to, but out of contact with, the photoresist layer. Amongst the advantages provided by the present invention is that the requirements of the permissible thickness of the photoresist layer suitable for writing high visibility gratings are relaxed, thus reducing the complexity and costs for processing the substrate.

45 Claims, 8 Drawing Sheets

METHOD AND APPARATUS FOR DIFFRACTIVE TRANSFER OF A MASK GRATING

FIELD OF THE INVENTION

The present invention is directed to a method an apparatus for microcircuit fabrication, and more particularly to lithographic techniques for exposing a photoresist layer.

BACKGROUND

In optoelectronic and optical devices, an optical grating can be provided by transferring the corresponding grating contained in a phase mask to a substrate for the device. One approach to transferring a mask grating to a substrate is to diffractively transfer light through the mask onto a layer of light sensitive photoresist on the substrate, thus exposing the positive photoresist with the transferred grating. Exposed portions of the photoresist may then be removed to produce a grating replicated in the photoresist. The replicated grating is then transferred to the substrate by a process such as chemical or reactive ion etching.

Diffractive transfer of a mask grating includes illuminating the mask grating with light of a given wavelength and coherence length, and replicating the mask grating in the photoresist by diffracting self-interfering light from the mask. The mask is positioned in contact with the photoresist whereby the maximum visibility of the transferred grating in the photoresist is obtained for the directly incident diffracting light. Some light is reflected, however, from the photoresist and substrate surfaces. The reflected light interferes with the directly incident light to cause an interference pattern. This generates an overlapping grating in the photoresist whose extent depends on the thickness of the photoresist. Also, the grating written in the photoresist may become distorted where there are gaps between the mask and the photoresist.

SUMMARY OF THE INVENTION

In view of the problems discussed above, there is a need for an improved technique of exposing a photoresist through a grating mask that reduces occurrence of the overlapping grating and also that avoids distortions in the exposed mask when there is a gap between the contact mask and the photoresist layer. Furthermore, the requirement for high visibility features to be written into the photoresist results in strict requirements on the permissible thickness of the photoresist layer, thus increasing the complexity and costs for processing the substrate.

Generally, the present invention relates to a method and apparatus for near field holography. The technique is particularly well suited to forming Bragg gratings on semiconductors and other materials that are used for wavelength selection in, for example, optical communications applications. The technique employs a phase grating held close to, but out of contact with, the photoresist layer. An advantage provided by the present invention is that the requirements of the permissible thickness of the photoresist layer are relaxed, thus simplifying the process and reducing costs.

In one embodiment, the invention is directed to a non-contact method for transferring a pattern from a phase mask to a photoresist layer on a substrate. The method includes adjusting a working distance between the phase mask and the photoresist layer so that the phase mask is not in contact with the photoresist layer and that the zero order and minus first order beams produce a primary grating in the photoresist layer and so as to reduce visibility of a secondary grating in the photoresist layer produced by an indirect light beam. The method also includes directing light to expose the photoresist through the phase mask to the photoresist layer so as to produce zero order and minus first order direct light beams, the light being of a wavelength to expose the photoresist.

In another embodiment, the invention is directed to a device for non-contact transfer of a pattern from a phase mask to a photoresist layer. The device includes means for directing light to expose the photoresist through the phase mask to the photoresist layer so as to produce zero order and minus first order direct light beams, the light being of a wavelength to expose the photoresist. The device also includes means for adjusting a separation distance between the phase mask and the photoresist layer so that the zero order and minus first order beams produce a primary grating in the photoresist layer and so as to reduce visibility of any secondary grating in the photoresist layer produced by one of the direct light beams and an indirect light beam originating from a surface reflection of a direct light beam from a light input surface of the photoresist layer.

Another embodiment of the invention is directed to a non-contact method for transferring a pattern from a phase mask to a photoresist layer on a substrate. The method includes adjusting a working distance between the phase mask and the photoresist layer so that the phase mask is not in contact with the photoresist layer, and directing light to expose the photoresist through the phase mask to the photoresist layer so as to produce zero order and minus first order direct light beams.

Another embodiment of the invention is directed to a device for non-contact transfer of a pattern from a phase mask to a photoresist layer on a substrate. The device includes means for adjusting a working distance between the phase mask and the photoresist layer so that the phase mask is not in contact with the photoresist layer, and means for directing light to expose the photoresist through the phase mask to the photoresist layer so as to produce zero order and minus first order direct light beams.

Another embodiment of the invention is directed to an apparatus for near field holography. The apparatus includes a phase mask holder holding a phase mask, a substrate holder holding a substrate having a photoresist layer proximate the phase mask, and a light source for delivering light to the phase mask, exposing light from the light source that has passed through the phase mask having a coherence length. At least one of the phase mask holder and the substrate holder is adjustable for selecting a separation distance between the substrate holder and the phase mask holder so that the phase mask is not in contact with the photoresist layer and that a first distance, corresponding to a distance travelled by a direct beam between the phase mask and the photoresist layer, is shorter than a second distance travelled by an indirect beam between the phase mask and the photoresist layer, by more than the coherence length of the indirect beam.

Another embodiment of the invention is directed to an apparatus for near field holography. The apparatus includes a phase mask holder, a substrate holder for holding a substrate having a photoresist layer proximate the phase mask when the phase mask holder holds a phase mask, and a light source for delivering light to the phase mask when the phase mask holder holds a phase mask. At least one of the phase mask holder and the substrate holder is adjustable for selecting a separation distance between the substrate holder and the phase mask holder so that, when the phase mask holder holds a phase mask and when the substrate holder holds a substrate having a photoresist layer proximate the phase mask, and not in contact with the phase mask, light from the light source directly incident on the photoresist layer through the phase mask produces substantially no overlapping grating in the photoresist layer with light from the light source indirectly incident on the photoresist layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
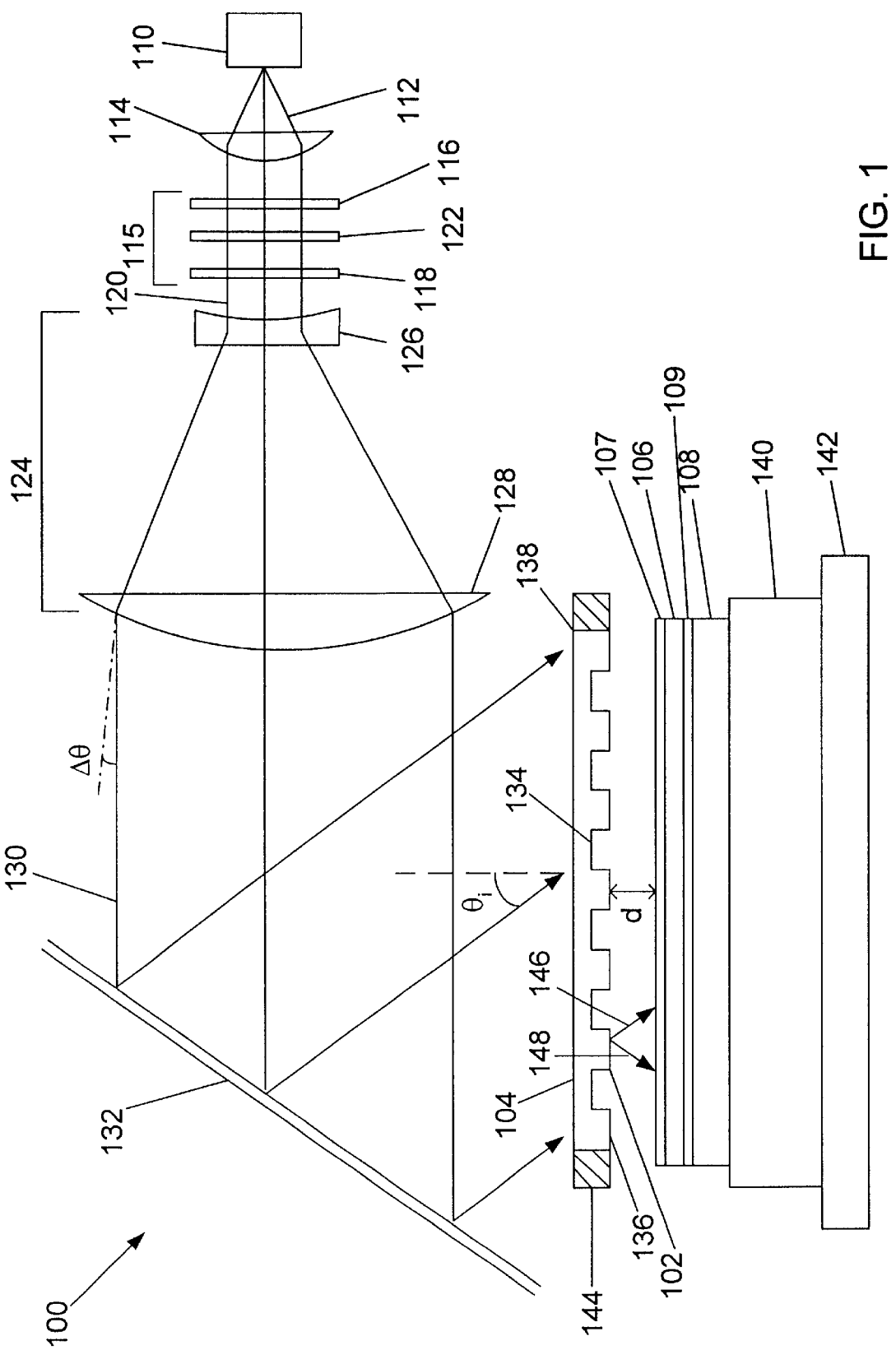
FIG. 1 schematically illustrates an embodiment of an apparatus for diffractive transfer of a grating according to the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to near-field holography and is believed to be particularly suited to a method of diffractively transferring a pattern from a phase mask to a photoresist on a substrate, wherein the pattern is illuminated with at least partially coherent light. The pattern exposed in the photoresist layer may be a grating and may be used in a photolithographic method for forming a grating in a semiconductor material, for example a grating used in a distributed Bragg reflector (DBR) laser, a distributed feedback (DFB) laser, or the like. The method may also be useful for forming gratings in glass and other transparent materials for components used in wavelength division multiplexed (WDM) applications in optical communications, and also in electro-optic materials, such as lithium niobate, for forming integrated optical components.

In near-field holography, the interference grating is formed by interference, not only between direct beams, but also between direct and indirect beams and between indirect beams. A direct beam is one that interacts with the photoresist layer after passing directly from the phase mask to the photoresist layer. An indirect beam interacts with the photoresist layer after being reflected between the substrate layers and the phase mask. Generally, interference between direct and indirect beams reduces the visibility of the grating formed in the photoresist layer by interference between the two direct beams.

According to the present invention, the phase mask is held sufficiently far from the photoresist layer so that there is no contact, and that the separation distance between the phase mask and the photoresist is sufficiently large as to reduce coherent relationships between the interfering direct and indirect beams. Where the light source produces light that is relatively incoherent, for example the light source may be a lamp, the separation distance may be in the range 5–30 $\mu$m, and more preferably in the range 5–20 $\mu$m. Where the light source produces more coherent light, for example where the light source is a laser, the separation may be longer and may be, for example, in the range 5–1000 $\mu$m. When the phase mask is separated from the photoresist layer, the visibility of the grating formed in the photoresist layer may be higher than when in contact, with the grating being formed primarily from light directly incident on the photoresist layer. The effects of overlapping gratings, formed as a result of indirect beams interacting with direct beams, are reduced. The method allows for optimization of the out-of contact distance to adjust the grating visibility.

The term "substantially no overlapping grating" is intended to mean that an overlapping grating can be present in the photoresist. However, the effect of the overlapping grating is reduced so that it does not influence the function of the primary grating in a specific application.

One particular embodiment for implementing the present invention is schematically illustrated in FIG. 1, which shows an exemplary near-field holographic apparatus 100 set up for diffractive transfer of a grating 102 in a phase mask 104 to a layer of photoresist 106 on a substrate 108.

A light source 110 is used as a source for ultraviolet (UV) light suitable for exposing the photoresist with the desired resolution. The light source 110 may be, for example, an arc lamp such as a mercury arc lamp, or a laser, such as a rare gas-halide laser. The light 112 produced by the light source 110 is preferably partially coherent to control the visibility of the grating when written on the photoresist. The term partially coherent is intended to cover both quasi-monochromatic and partially collimated light.

The light 112 emitted from the light source 110 may be at least partially collimated by a first lens 114. Where the light source is a mercury arc, the arc is preferably oriented so that its image is ultimately parallel to the grating grooves 134 formed in the photoresist layer 106. A mercury lamp having a small/medium arc is particularly advantageous for producing a small image on the phase mask 104. The mercury arc lamp may be a high pressure, small/medium arc mercury lamp that provides a source of ultraviolet radiation in the spectral region ranging between 180 nm–600 nm. A high pressure lamp typically contains mercury at a pressure in the range 1 to 5 atm. The length of the mercury arc in a small/medium lamp is typically in the range between 0.5 mm and 4 mm, and the arc-length to arc-width ratio is typically greater than 2. An example of a suitable mercury arc lamp is model "HBO 200W/2" manufactured by Osram. This lamp produces ultraviolet radiation in the spectral region between 200 nm–600 nm.

The first lens 114, that collimates the light form the lamp 110, may be any suitable type of collimating lens, such as a plano-convex lens as illustrated. The lens may be formed from quartz or any other material that is transparent to the UV light 112.

After passing through the lens 114, the light is conditioned in the conditioning unit 115. The conditioning unit 115 operates on the light to select the properties of the light incident on the photoresist layer. The conditioning unit 115 may be used, for example, to adjust the polarization state of the light reaching the photoresist layer 106, the bandwidth of the light 112, or the uniformity of illumination. In particular, the light may be filtered to produce substantially quasi-monochromatic light. The conditioning unit 115 may include a white light filter 116 and an interference filter 118, whereby the bandwidth $\Delta\lambda$ of the illuminating light may be tuned to a desired mercury line for exposing the photoresist layer 106. The bandwidth of the conditioned light 120 transmitted form the conditioning unit 115 is preferably selected according to the desired visibility of the grating to be written in the photoresist layer 106. The relationship between bandwidth and grating visibility is discussed more fully below. The bandwidth may be less than about 10 nm and may be approximately 2–4 nm for a center wavelength of 365 nm.

The conditioning unit 115 may also include a polarizer 122 to polarize the light 112. The use of polarized light may increase the visibility of the interference pattern formed by the phase mask 104, since the diffraction efficiency of the phase mask 104 may be polarization dependent.

The conditioned light beam 120 may then be expanded, typically using a beam expansion telescope 124. The beam expanding telescope 124 may be formed from two lenses 126 and 128. The negative expanding lens 126 diverges the light 120 towards the collimating lens 128 that re-collimates the light as an expanded beam 130. It will be appreciated that other types of telescope may be used. The telescope 124 is preferably arranged to reduce aberrations in the expanded beam 130. For example, where the expanding lens 126 is a plano-concave lens, the concave side may be directed towards the collimating lens 114 to reduce spherical aberration. Likewise, where the collimating lens 128 is plano-convex, the planar side may be directed towards the expanding lens 126 to reduce spherical aberration. In one particular embodiment, the expanding lens 126 is made of quartz, has a diameter of 55 mm, and a radius of curvature of –56.81 mm on the convex side. The collimating lens 128 may also be made from quartz, with a lens diameter of 100 mm, and a convex surface having a radius of curvature of 208.5 mm. In this arrangement, the collimating lens only collimates the center 100 mm of the diverging beam from the expanding lens 126. The use of the center portion of the diverging beam increases the coherence of the expanded beam 130 emitted from the telescope 124.

The degree of collimation of the expanded beam 130 is given by $\Delta\theta$, and is determined by the divergence angle of the conditioned light beam 120 entering the telescope, and the ratio of the focal lengths of the expanding lens 126 and the collimating lens 128. A divergence as low as 0.0005 radians may be achieved using the set-up described above.

The quality of the grating transferred to the photoresist layer 106 depends on its visibility. Generally, for two interfering beams of equal intensity, the visibility depends on the degree of mutual coherence which is determined by both temporal and spatial coherence. The beam expanding telescope 124 and the conditioning unit 115 permit tuning the degree of mutual coherence to an optimum for a given separation distance between the photoresist layer 106 and the phase mask 104.

The expanded beam 130 transmitted from the beam expanding telescope 124 therefore has a coherence length that is dependent upon the type of light source used, the conditioning that takes place in the conditioning unit 115 and the beam expanding telescope 124.

The expanded beam 130 is directed, at an angle $\theta_i$, to the phase mask 104 via a beam steering mirror 132. It will be appreciated, however, that the expanded beam 130 may be directly incident on the mask 106 from the beam expanding telescope 124. The steering mirror 132 is advantageous for adjusting the angle at which the expanded beam 130 is incident on the mask 104. The incident angle, $\theta_i$, may be the Bragg angle for the phase mask 104.

The phase mask 104 includes surface relief grooves 134 in the light emitting face 136 of the phase mask 104 opposite the light receiving face 138. It will be appreciated, however, that the phase mask 104 may also be used in an inverted position, with the light 130 incident on the grooves 134. The phase mask 104 is typically held in a phase mask holder 144. The phase mask holder may be movable relative to the photoresist layer 106.

The photoresist layer 106 is sensitive to light at the wavelength selected for forming the interference grating using the phase mask 104. A suitable photoresist is Shipley 1828 photoresist supplied by Micro Resist Technology, Berlin, Germany. The photoresist layer 106 is applied to the substrate 108 using any suitable technique, such as spin coating. The substrate 108 may be supported by any suitable method, for example using a chuck 140. The chuck 140 may be supported on a micropositioning apparatus 142, such as a mask aligner. Antireflection (AR) coating layers may be disposed above the photoresist layer 106 as AR layer 107 and/or between the photoresist layer 106 and the substrate 108 as AR layer 109.

The mask 104 is separated from the photoresist layer 106 by the out-of-contact distance, d, which, for a mercury lamp source, is typically in the range of 5–30 $\mu$m, and may be in the range 5–20 $\mu$m. The out-of-contact distance may also be referred to as the working distance. The out-of-contact distance, d, may be varied by adjusting the micropositioning apparatus 142 and/or the mask holder 144.

Figure 2:
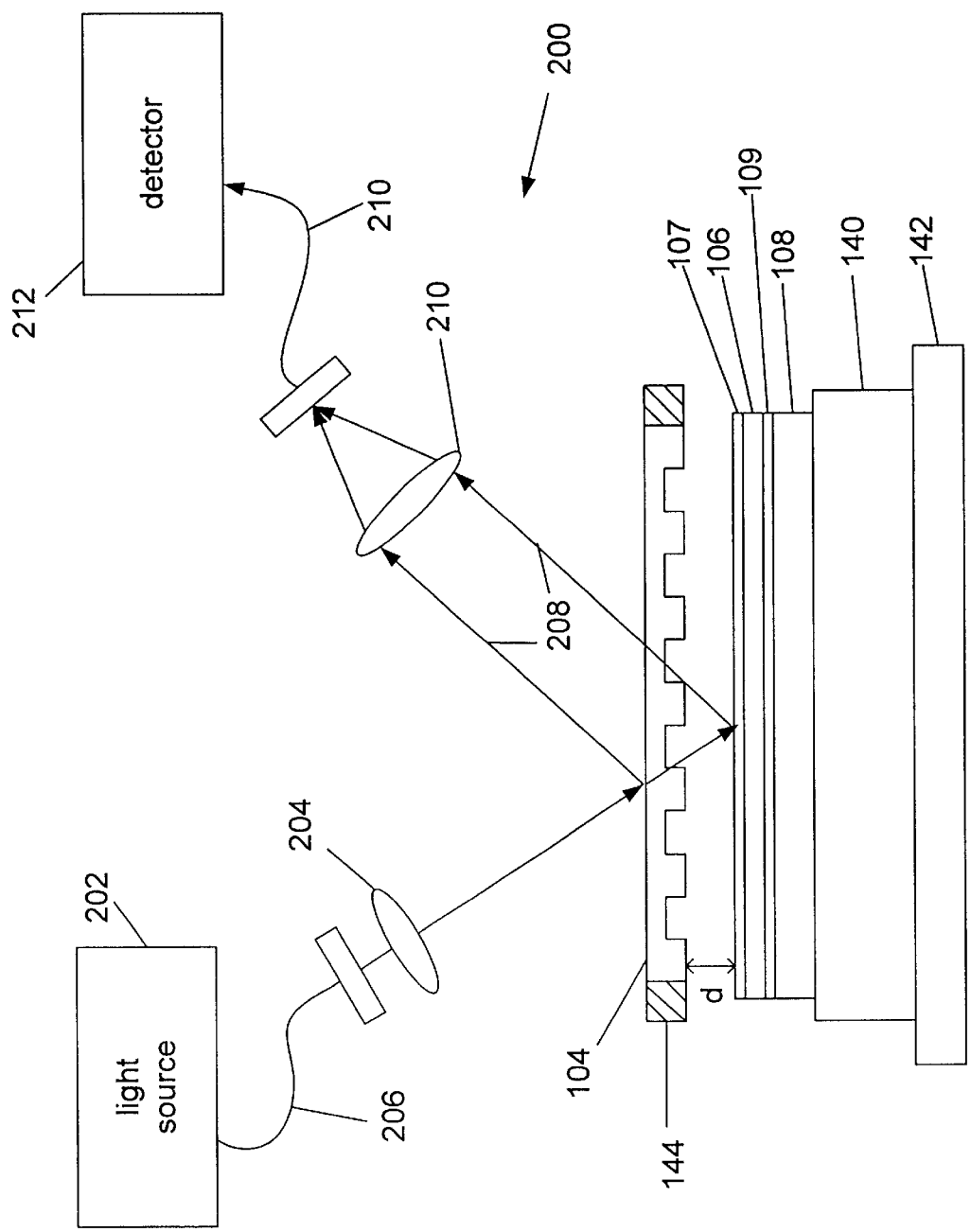
FIG. 2 schematically illustrates an embodiment of an apparatus for measuring the optical distance between a phase mask and a substrate according to the present invention.

The out-of-contact distance, d, may be measured by interference measurements, for example using the apparatus 200 illustrated in FIG. 2. Light from a broadband light source 202, for example visible light, is focused simultaneously on the photoresist layer 106 and the light emitting side of the phase mask 104 by a lens 204. The light may be directed from the light source 202 via a fiber or fiber bundle 206.

The light 208 reflected from the photoresist 106 and from the phase mask 104 is collected by a condensing lens 210 and is directed to a spectrometer 212. The light 208 may be directed to the spectrometer 212 via a fiber 214. The distance between the phase mask 104 and the photoresist 106 is found from the interference in the reflected light 208. This interference gives rise to wavelength dependent extrema. The gap distance, d, is determined form the position of these extrema using the following formula:

$$d = (M_{ab} \lambda_a \lambda_b)/(2(\lambda_a - \lambda_b) \cos(\theta))$$

The detector of the spectrometer detects extrema in the light passing through the spectrometer when the spectrometer wavelength is scanned. The extrema are either maxima or minima in intensity. $M_{ab}$ is the number of extrema detected by the spectrometer, divided by two, when scanning between $\lambda_a$ and $\lambda_b$, and $\lambda_a$ is the wavelength position for the extremum with the longest wavelength, while $\lambda_b$ is the wavelength position for the extrema with the shortest wavelength. $\theta$ is the angle of incidence on the photoresist 106.

This measurement may be used to correct for any non-uniformity in the out-of-contact distance, d, and the non-uniformity corrected before the photoresist 106 is exposed to the UV light 130. The out-of-contact distance, d, is typically measured over a part of the 108 substrate, but may also be measured over the whole substrate 108.

The collimated light beam 130 is directed onto the phase mask 104 via the mirror 132, at an angle of incidence $\theta_i$, whereby the phase mask produces diffracting beams. If the wavelength of the light is $\lambda$ and the period of the grating is $\Lambda$, then the grating produces two interfering diffraction beams when the angle of incidence fulfills the condition:

$$\tfrac{1}{2}(1 - \sin\theta_i) < \lambda/\Lambda < 1 - \sin\theta_i.$$

The first diffraction beam is the zero order beam 146 that passes through the phase mask 104 substantially undeflected and the second beam 148 is diffracted by the phase mask 104 into the minus first order. When the angle of the minus first order beam 148 is $-\theta_i$, the phase mask 104 is said to be illuminated under the Bragg condition, or at the Bragg angle. The relative intensities of the two beams 146 and 148 may be made to be approximately equal by adjusting the grating profile and grating depth of the phase mask 104.

Figure 3A:
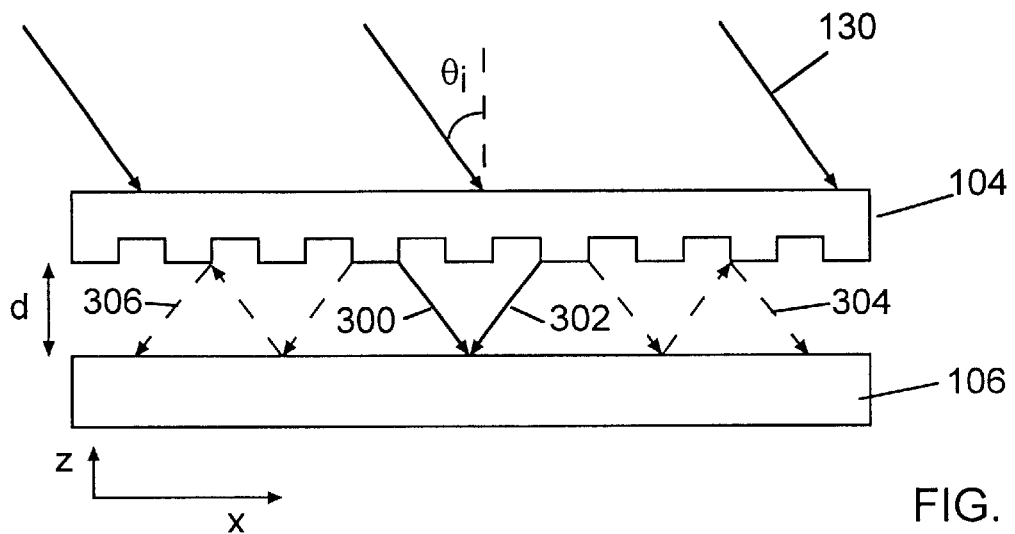
FIGS. 3A–3B schematically illustrate different light beams that can give rise to interference in the photoresist layer.
Figure 3B:
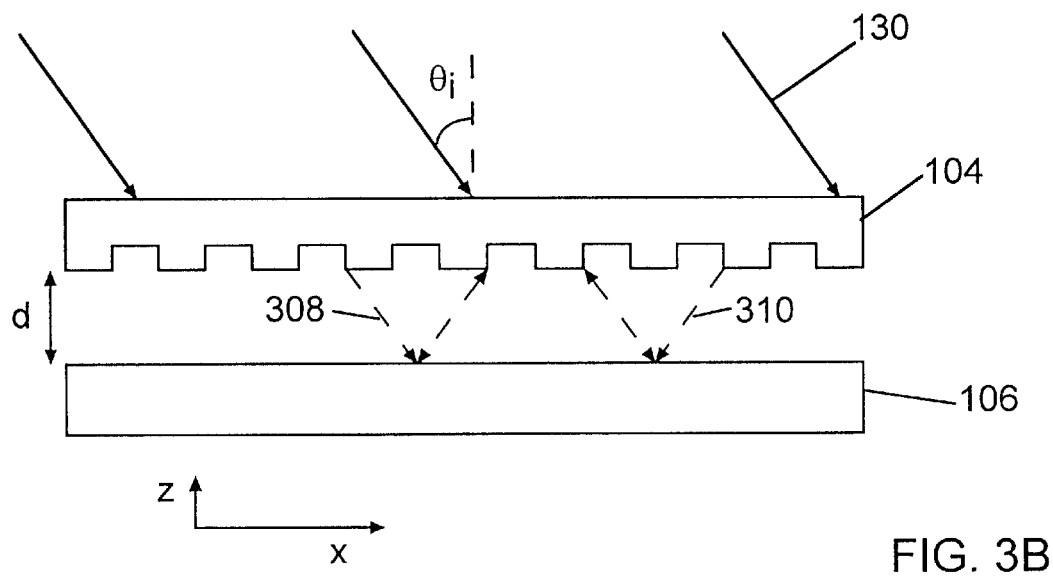

FIGS. 3A and 3B illustrate different light beams that propagate between the phase mask 104 and the photoresist layer 106. Under certain conditions, these different light beams may contribute to the production of an interference grating in the photoresist. The collimated beam 130 is incident on the phase mask 104 at incident angle $\theta_i$. The zero order beam 300 corresponds to light that travels directly through the phase mask 104 without angular deviation. The minus first order beam 302 is light that is diffracted into the minus first order by the phase mask. Both the zero order and the minus first order beams 300 and 302 are direct beams (shown with solid lines). Direct beams are beams that pass directly from the phase mask 104 to the photoresist layer 106.

A beam that is reflected to the phase mask 104 and then redirected by the phase mask 104 to the photoresist layer 106, is referred to as an indirect beam. Indirect beams are illustrated in FIGS. 3A and 3B with dashed lines. Light beam 304 is initially directed in the same direction as the zero order direct beam 300, but is reflected off the substrate 108, photoresist layer 106 or antireflection coating 107 or 109, back to the phase mask 104 and is then redirected back to the photoresist layer 106 by the phase mask 104. Light beam 306 initially is directed in the same direction as the minus first order direct beam 302 but is reflected off the substrate 108, photoresist layer 106 or antireflection coating 107 or 109, back to the phase mask 104 and is reflected back to the photoresist layer 106 by the phase mask 104.

Another type of indirect beam 308 initially starts off in the same direction as the zero order direct beam 300, but reflects off the substrate 108, photoresist layer 106 or antireflection coating 107 or 109, back to the phase mask 104. The beam 308 is diffracted back to the photoresist layer 106 in a direction approximately antiparallel to the direction incident on the phase mask 104. Another type of indirect beam 310 initially starts off in the same direction as the minus first order direct beam 302, but reflects off the substrate 108, photoresist layer 106 or antireflection coating 107 or 109, back to the phase mask 104. The beam 310 is diffracted back to the photoresist layer 106 in a direction approximately antiparallel to the direction incident on the phase mask 104.

Each of the beams 300–310 interacts with the others. The interactions involving one or more indirect beams may be divided into two groups. The first group shows little variation in the x-direction, but demonstrates a periodic variation of $(\lambda \cos(\theta_i))/2$ along the z-direction due to the phase differences between interacting beams. This introduces a variation in the visibility of the grating along the x-direction due to gap variation. It is, therefore, important to reduce the contribution from the indirect beams. Examples of interactions that fall into this first group include interactions between beams 300 and 304, and between beams 302 and 306. A second group of interactions has a periodical variation in the x-direction which has a period approximately the same as the period of the interaction between the two direct beams 300 and 302. This second group has the same variation in the z-direction as the first group. Examples of interactions in this second group include interactions between beams 300 and 308, and between beams 302 and 310.

The first group of interactions typically give rise to different d.c. contributions to the irradiance in the photoresist layer 106, the magnitude of these contributions being dependent on the magnitude of d. The second group of interactions typically gives rise to spatially varying contributions to the irradiance in the photoresist layer 106, which also depend on the magnitude of d. interference grating formed by the interaction between the two direct beams 300 and 302 is referred to as a primary grating. All other interference gratings, whether or not formed by the direct beams 300 and 302, are referred to as secondary gratings.

There are typically imperfections in the setup, however, for example small variations in the thickness of the phase mask 104 and in the out-of-contact distance between the phase mask 104 and the photoresist layer 106. Variations in the out-of-contact distance may result from variations in the thickness of the phase mask 104, substrate 108, photoresist layer 106 or the antireflection layers 107 or 109. The indirect beams give rise to overlapping gratings because of these imperfections. Both the overlapping gratings and the d.c. contributions reduce the visibility of the desired periodic grating structure induced in the photoresist layer 106. Therefore, it is an important goal to reduce, if not eliminate, the interference of various indirect beams that produces the DC contributions and the overlapping gratings.

The out-of-contact distance is preferably adjusted to be within ±1 µm from a desired value for the out-of-contact distance. Preferably, the visibility of the fringes in the primary grating produced by the direct zero and minus first order beams 300 and 302 is greater than 80%, and more preferably greater than 90%. High quality exposure of the photoresist layer 106 is obtained by careful selection of the out-of-contact distance, d.

Consider a phase mask with period Λ, illuminated at the first Bragg angle using partially coherent light with a center wavelength λ fulfilling the condition: ⅔Λ≦λ≦2Λ. The incident light diffracts into the zero and minus first orders, as discussed above. The relative intensity of the diffraction orders depends on the depth and shape of the grating. A properly optimized grating has almost identical intensity in the two orders. Here we calculate the sharpness of the interference fringes, also known as the visibility, due to interference between the indirect and direct beams as illustrated in FIGS. 3A and 3B. It is assumed in the calculations that the two diffracted beams are of equal intensity.

When considering temporal coherence we compare a light wave, E(t), with itself at different times, t and t+τ. When considering spatial coherence we compare light waves, E(r,t), at different points $r_1$ and $r_2$ in space. In the more general case of spatiotemporal coherence we consider both different times and different spatial points.

The total electrical field arising due to the light in the photoresist layer 106 is found by first performing coherent addition of the direct and indirect fields between the phase mask 104 and the photoresist layer 106, taking into account the reflection from the substrate 108, the photoresist layer 106 and antireflection layer either above or below the photoresist layer 106, the diffraction from the phase mask 104, the time delay of the indirect fields, angular dispersion and collimation. Second, an integration is performed over divergence angle and wavenumber. An analysis of the incoherent addition of intensities is provided in "Analysis of grating formation with excimer lasers irradiated phase mask", published by P. E. Dyer, R. J. Farley and R. Giedl in Optics Communications vol. 115, 1995, pp. 327–334, incorporated herein by reference.

Having obtained the total electrical field, the total intensity can be calculated and the visibility of the interference fringes is determined as a function of out-of-contact distance, d, as $$V(d)=(I_{max}(d)-I_{min}(d))/(I_{max}(d)+I_{min}(d)) \quad (1)$$

where $I_{max}$ is the maximum intensity on the interference grating and $I_{min}$ is the minimum intensity. The visibility for a given distance, d, may be found by finding the maximum and minimum intensity at that distance.

The field contributions, $E_0$ and $E_1$, for the zero order and minus first order beams 300 and 302 respectively, immediately following the phase mask 104 are given by:

$$E_0=\eta_0 e^{ik(x\,sin(\theta)+z\,cos(\theta))} \quad (2)$$

$$\text{and } E_1=\eta_{-1} e^{ik(x\,sin(\theta 1)+z\,cos(\theta 1)+\phi 1)} \quad (3)$$

where $\eta_i$ is the diffraction intensity into the ith diffraction order, (i=0, −1), φ1 is the phase difference due to oblique wavefront between interfering waves, k is the wavenumber, θ is the incident angle on the phase mask 104 and θ1 is the diffraction angle of the minus first order. The presence of the photoresist layer 106, substrate 108 and the optional antireflection layers 107 and/or 109 means that multiple interference has to be considered. The lowest order contributing fields are:

$$E_2=r_{12}\eta_0 e^{ik(x\,sin(\theta)+z\,cos(\theta)+\phi 2)} \quad (4)$$

$$E_3=r_{12}\eta_0 e^{ik(x\,sin(\theta 1)+z\,cos(\theta 1)+\phi 3)} \quad (5)$$

$$E_4=r_{12}\eta_{-1} e^{ik(x\,sin(\theta 1)+z\,cos(\theta 1)+\phi 4)} \quad (6)$$

$$E_5=r_{12}\eta_{-1} e^{ik(x\,sin(\theta)+z\,cos(\theta)+\phi 5)} \quad (7)$$

where $r_{12}=(R_{pm}\cdot R_{sub})^{1/2}$ and $R_{pm}$ is the diffraction efficiency from the phase mask 104 and $R_{sub}$ is the reflectance of the substrate 108 and the thin film layers, including the photoresist layer 106 and any antireflection layer. The phase angles $\phi_2, \ldots, \phi_5$, represent the phase terms due to reflection and due to the oblique wavefront. $E_2$ corresponds to beam 304, $E_3$ corresponds to beam 308, $E_4$ corresponds to beam 306 and $E_5$ corresponds to beam 310, shown in FIGS. 3A and 3B. The total irradiance, $I_{tot}$, produced by light having different wavevectors and incident angles is thus given by:

$$I_{tot}=\int\int D_k D_\theta \sum_{i,j=0}^{5} E_i E_j^* d\theta dk \quad (8)$$

where $D_k$ and $D_\theta$ are the distribution functions for wavenumber and incident angle respectively.

Figure 4:
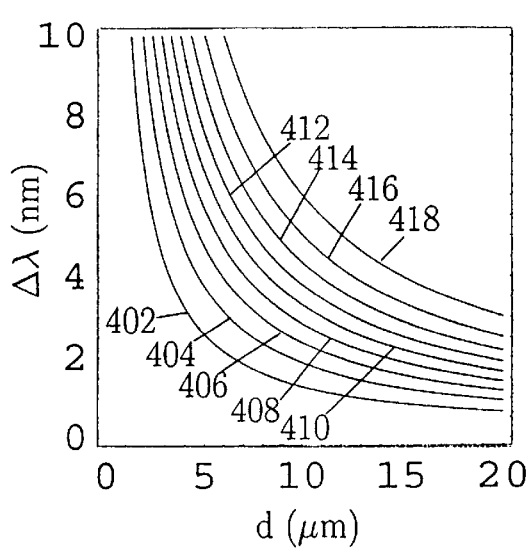
FIGS. 4A–4D show graphs of fringe visibility of a grating formed by direct light rays as a function of out-of-contact distance and bandwidth of light incident on the photoresist layer, for different values of collimation, without the consideration of indirect beams.
Figure 4:
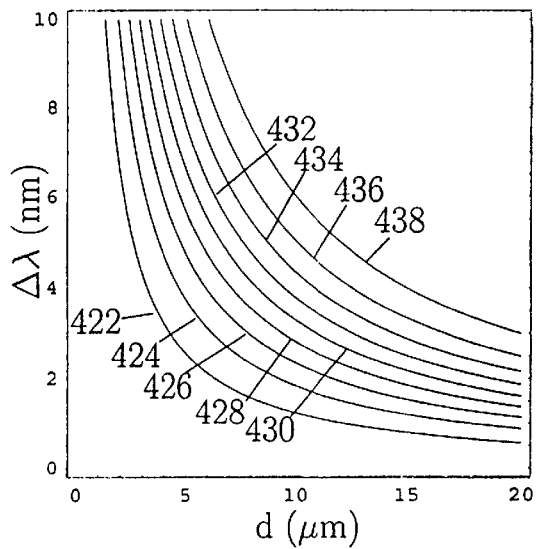
Figure 4:
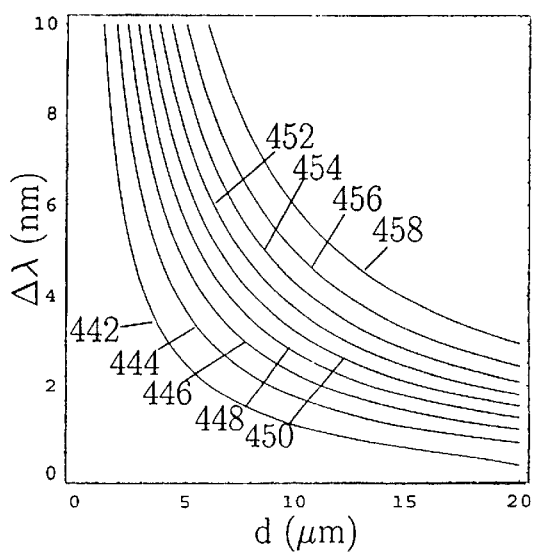
Figure 4:
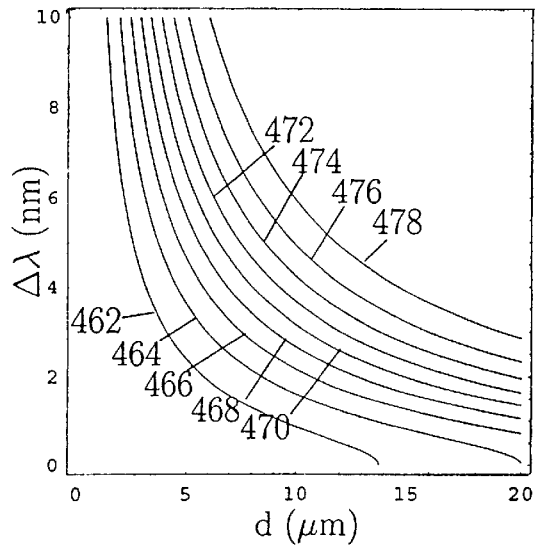

The visibility of the grating induced in the photoresist layer 106 is shown in FIGS. 4A–4D for gratings formed by the direct beams ($E_0$ and $E_1$) only. The visibility curves are plotted as a function of out-of-contact distance, d, in μm, along the x-axis and bandwidth of the illuminating light 130, Δλ, in nanometers, along the y-axis. For each of these curves, the assumed wavelength was 365 nm, the incident angle, $\theta_i$, was 49.5°, and the expanded light beam 130 was assumed to have a Gaussian intensity distribution. In FIG. 4A, the assumed full width, half maximum (FWHM) divergence, Δθ, was zero radians. The area to the left of curve 402 has a visibility of 1 and the area between curves 402 and 404 has a visibility of 0.9 or more. Therefore, curve 402 may be referred to as the 90% contour and curve 404 referred to as the 80% contour. Curves 406, 408, 410, 412, 414, 416 and 418 are the 70%, 60%, 50%, 40%, 30%, 20%, and 10% contours respectively. In FIG. 4B, the assumed divergence was 0.001 radians and curves 422, 424, 426, 428, 430, 432, 434, 436 and 438 are the 90%, 80%, 70%, 60%, 50%, 40%, 30%, 20%, and 10% contours respectively, In FIG. 4C, the assumed divergence was 0.002 radians and curves 442, 444, 446, 448, 450, 452, 454, 456 and 458 are the 90%, 80%, 70%, 60%, 50%, 40%, 30%, 20%, and 10% contours respectively. In FIG. 4D, the assumed divergence was 0.003 radians and curves 462, 464, 466, 468, 470, 472, 474, 476 and 478 are the 90%, 80%, 70%, 60%, 50%, 40%, 30%, 20%, and 10% contours respectively. It is apparent from FIGS. 4A–4D that the visibility, in general, increases with reduced bandwidth, in other words with increasingly coherent light. Also, the visibility generally falls with increased out-of-contact distance, d.

Figure 5:
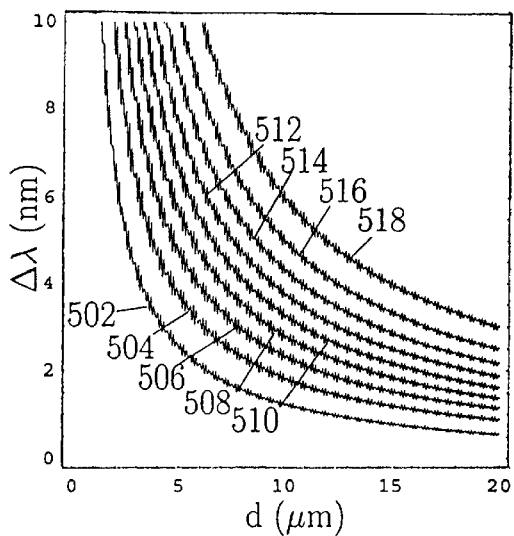
FIGS. 5A–5D show graphs of fringe visibility of a grating formed by direct and indirect light rays as a function of out-of-contact distance and bandwidth of light incident on the photoresist layer, for different values of light reflection, with consideration of direct beams.
Figure 5:
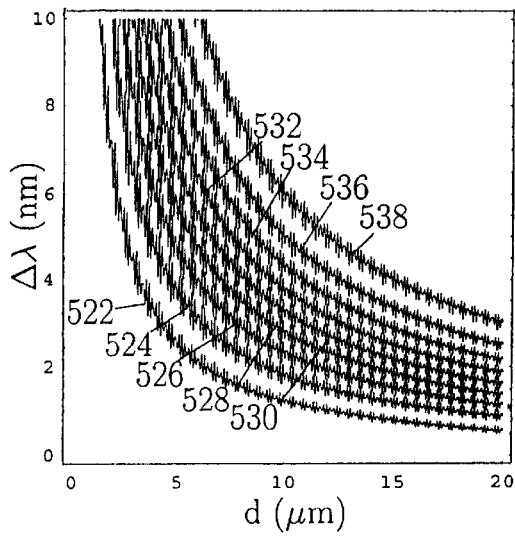
Figure 5:
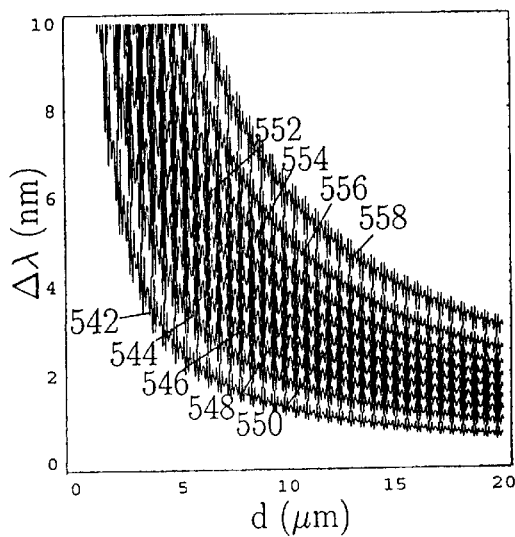
Figure 5:
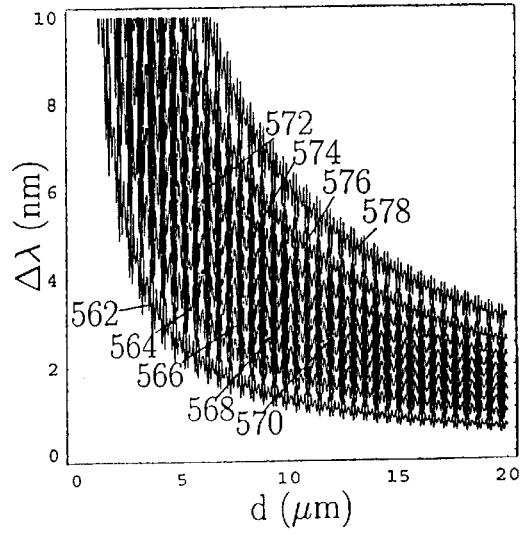

The visibility is also shown in FIGS. 5A–5D calculated for both direct and indirect beams, for a beam divergence of 0.001 radians. The same values for wavelength and incident angle were used as were used to generate the curves in FIGS. 4A–4D. In FIG. 5A, the reflectivity factor, $r_{12}$, was 0.05. Curves 502, 504, 506, 508, 510, 512, 514, 516 and 518 are the 90%, 80%, 70%, 60%, 50%, 40%, 30%, 20%, and 10% contours respectively. In FIG. 5B, the reflectivity factor was 0.1 and curves 522, 524, 526, 528, 530, 532, 534, 536 and 538 are the 90%, 80%, 70%, 60%, 50%, 40%, 30%, 20%, and 10% contours respectively. In FIG. 5C, the reflectivity factor was 0.015 and curves 542, 544, 546, 548, 550, 552, 554, 556 and 558 are the 90%, 80%, 70%, 60%, 50%, 40%, 30%, 20%, and 10% contours respectively. In FIG. 5D the reflectivity factor was 0.2 and curves 562, 564, 566, 568, 570, 572, 574, 576 and 578 are the 90%, 80%, 70%, 60%, 50%, 40%, 30%, 20%, and 10% contours respectively. The boundaries between the regions of different visibility are less well defined than for the cases illustrated in FIGS. 4A–4D, particularly for higher reflectivity. This is a result of considering interference from the indirect beams.

FIGS. 5A–5D show that the oscillation amplitude due to the phase difference of the reflected beams, resulting in the "fuzzier" contours than are seen in FIGS. 4A–4D, is greater for smaller values of d than for larger values. It is also apparent that it is possible to simultaneously achieve low oscillation amplitude and high visibility by selecting optimal bandwidth and optimal distance, d. A preferred set of operating parameters is that $r_{12}$ is less than 0.1, the bandwidth $\Delta\lambda$ is less than 4 nm and the visibility is around 85%, corresponding to a separation distance of about 6 μm.

This parameter range may be used to provide a larger process window than is available using contact near-field holography. One of the limits of contact near-field holography is that the thicknesses of the photoresist layer 106, and any antireflection layers 107 and 109, need to be controlled within tight limits in order to reduce the effect of indirect beams on the grating visibility.

Figure 6:
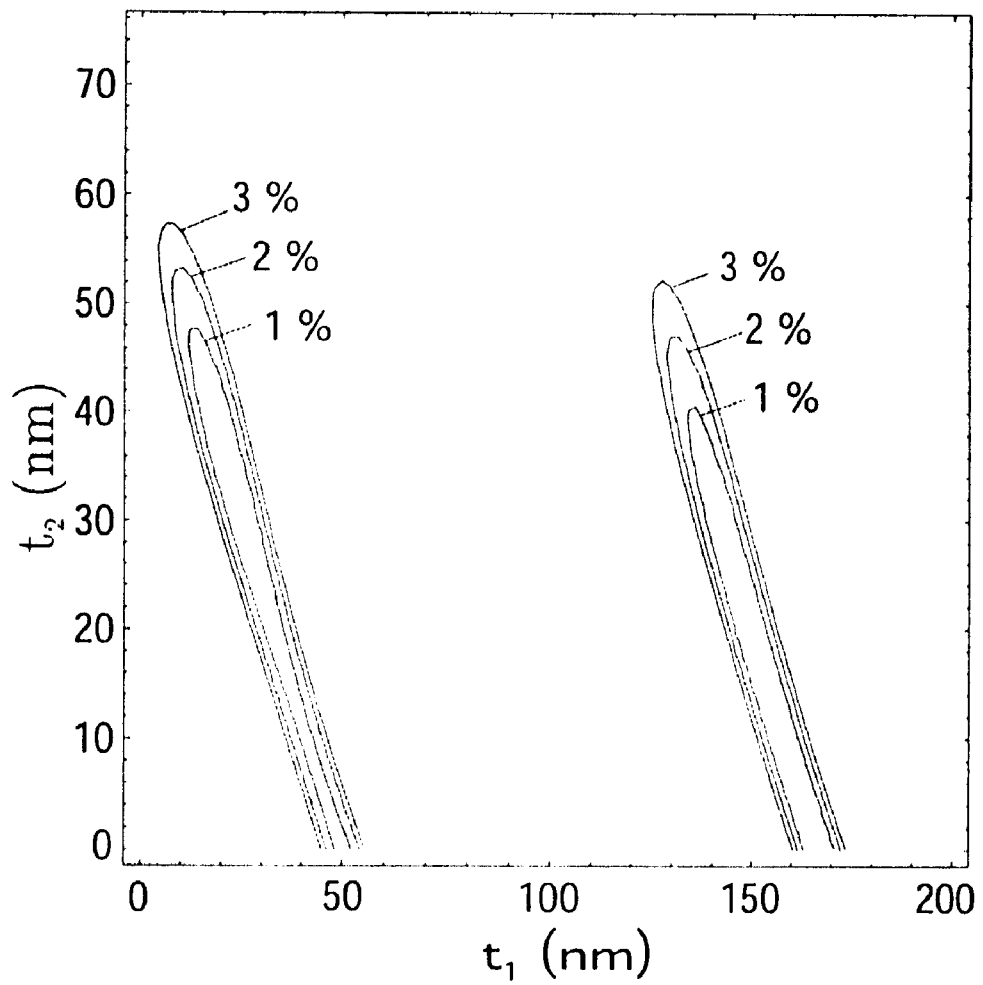
FIG. 6 illustrates a graph showing reflectance contours for a phase mask in contact with the photoresist layer, as a function of photoresist layer thickness and antireflection coating layer thickness.

FIG. 6 illustrates three reflectance contours for reflectance of 1%, 2% and 3% from the substrate and thin film layers as a function of the thickness, $t_1$, of the photoresist layer, and the thickness, $t_2$, of the antireflection coating layer, when the phase mask is in contact with the photoresist layer. The thickness of the photoresist layer is required to be within a window of around 6 nm in order to obtain a reflectance of less than 1%. This is difficult to obtain using inexpensive techniques, such as spin coating, and requires that the spin coating machine should be calibrated each time in order to achieve a photoresist or antireflection coating layer of correct thickness.

Figure 7:
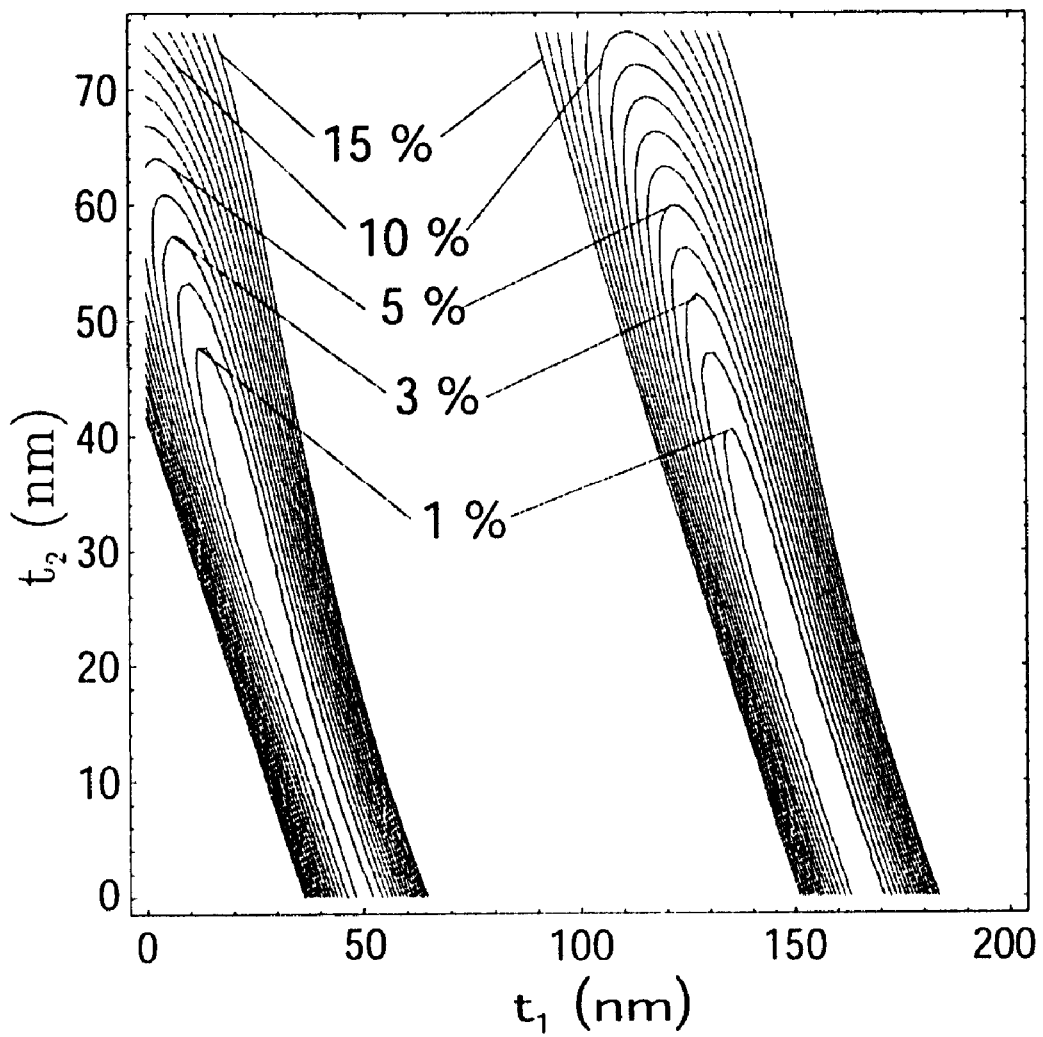
FIG. 7 illustrates a graph showing reflectance contours for a phase mask out of contact with the photoresist layer, as a function of photoresist layer thickness and antireflection coating layer thickness.

In contrast, the non-contact case provides more relaxed restrictions on the photoresist layer thickness. For non-contact processing, the tolerance for the photoresist thickness is the condition $r_{12}<0.01$. Using a typical value of 7% diffraction efficiency for $R_{pm}$ in the equation for $r_{12}$, this corresponds to a value of $R_{sub}$ for the non-contact case of about 14%. FIG. 7 illustrates contours of $R_{sub}$ as a function of the thickness of the photoresist layer, $t_1$, and the thickness of the antireflection coating layer, $t_2$, when the phase mask is out of contact with the photoresist layer. The contours are illustrated in 1% steps, with 1%, 3%, 5%, 10% and 15% contours labeled. The relatively large permitted variation in $R_{sub}$ results in a photoresist layer thickness range of about 30 nm. Non-contact exposure therefore enlarges the process window for the photoresist layer 106 from about 6 nm to about 30 nm. It is significantly easier to deposit the photoresist layer 106 to a thickness tolerance of about 30 nm as compared to a tolerance of 6 nm in the contact case. Therefore, the non-contact approach eases process restrictions imposed in the contact approach.

In addition to selecting the spacing, d, on the basis of theoretical considerations, the spacing, d, may also be selected using experimental measurements of the visibility of transferred direct and overlapping gratings in the photoresist layer 106 for a given configuration of the optical set up. The coherence length of the exposing light that interacts with the photoresist layer 106 may be measured by measuring the fringe visibility induced in the photoresist layer 106 for a number of different separations between the phase mask 104 and the photoresist layer 106. The coherence length of the exposing light is defined as that separation distance between the phase mask 104 and the photoresist layer 106 at which the visibility has fallen to 1/e of the maximum fringe visibility value of all interacting beams.

The exposing light is formed from two components, direct beams and indirect beams. The direct beams, taken alone, have a longer coherence length than the indirect beams, so the overall coherence length of the exposing light typically has a coherence length that is less than the coherence length of the direct beams alone. The coherence length of an indirect beam, defined as the distance at which the visibility of an interference pattern formed between a direct beam and the indirect beam falls to 1/e of the maximum of all intersecting beams, is inherently dependent on the value of $r_{12}$. Typically, for a given bandwidth of exposing light, the visibility is higher for smaller separations between the photoresist layer and the phase mask. However, by separating the photoresist layer from the phase mask according to the principles set forth herein, the deleterious effects of direct beams are reduced.

The interference fringes for the direct propagating beams may be also be measured to a high accuracy using, for example, a Michelson interferometer equipped with a 50/50-beam splitter at the appropriate wavelength, for example as discussed in "Principles of Optics" by Max Born and Emil Wolf, Pergamon Press, Oxford, $6^{th}$ edition, 1980, pages 300–323, and 499–518, incorporated herein by reference.

Figure 8:
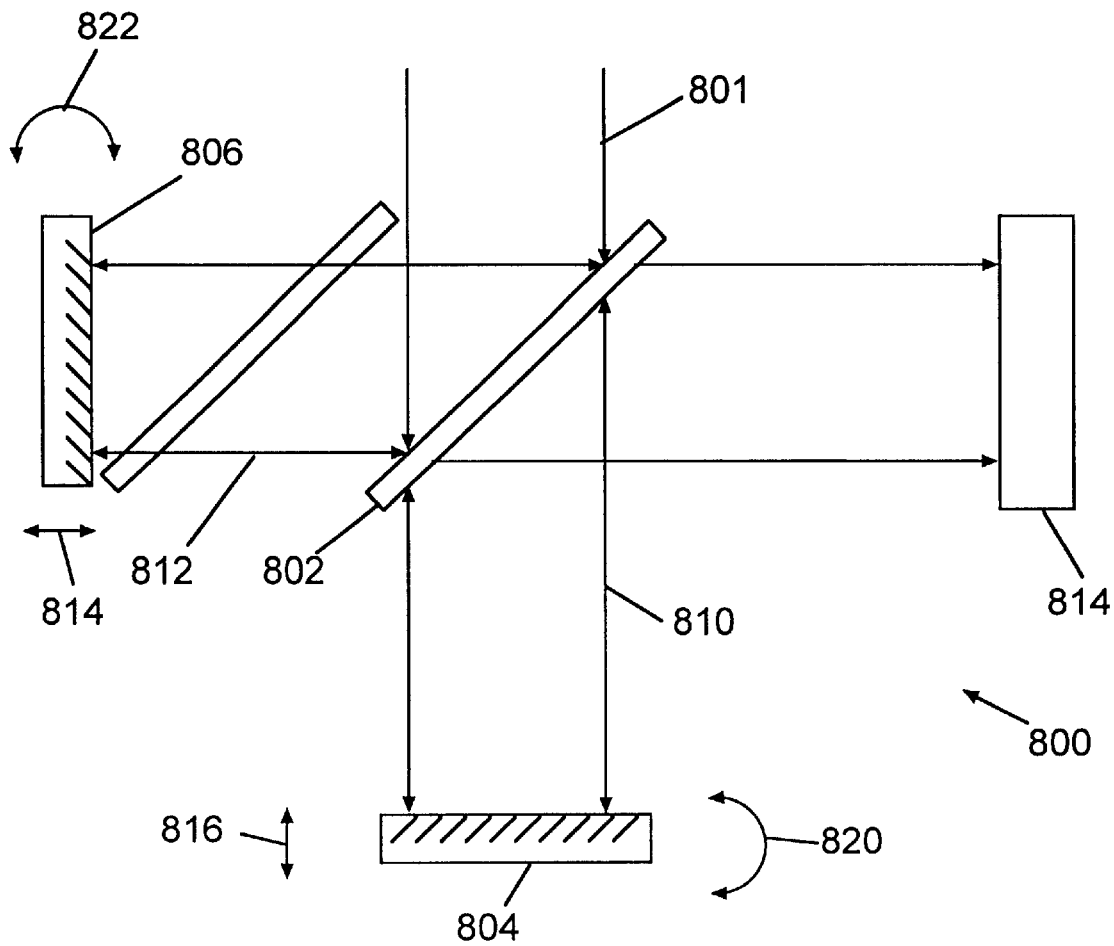
FIG. 8 schematically illustrates an apparatus used for measuring visibility of interference fringes formed using light from the light source, according to the present invention.

One method of measuring the fringe visibility is discussed with reference to FIG. 8. The method uses a Michelson interferometer 800, having a 50/50 beamsplitter 802, and two reflectors 804 and 806. A compensating plate 808 may be positioned between one of the reflectors 804 and the beamsplitter 802 to compensate for the other beam travelling through the beamsplitter 802. One of the direct beams 300 or 302 is directed into the beamsplitter 802, which directs beams of equal intensity towards the two mirrors 804 and 806. The two mirrors reflect beams 810 and 812 that are combined at the beamsplitter 802 and form an interference pattern at the detector 814. It will be appreciated that the Michelson interferometer 800 may be different from that illustrated, for example it may not include a compensating plate 808, or the mirrors may be replaced by retroreflecting prisms.

First, the mirror positions are optimized for spatial and temporal coherence by setting the lengths of the different arms to be equal, and for the two reflected beams 810 and 812 to completely overlap at the detector 814. This condition, with no path length difference, produces white light fringes.

Second, the position for the temporal coherence is moved away from the optimal position in appropriate steps by translating one or more of the mirrors 804 and 806 in the directions of arrows 816 and 818. At each translation step, data is acquired using the detector 814 which may be, for example, a CCD or photodiode array that is sensitive to the wavelength of light being used. The visibility is calculated from equation (1), with the modification that d represents the movement of the temporal coherence mirror/prism away from the optimal position.

The alignment of the mirrors 804 and 806 may also be adjusted by rotating one or both of the mirrors 804 and 806 in the directions of arrows 820 and 822 so that one part of the wavefront of the first beam 810 interferes with a different part of the wavefront of the second beam 812. In other words, the beams 810 and 812 are sheared with respect to each other. If the amount of shear corresponds to the relative shift of the wavefronts between the zero order and minus first order beams, then an accurate measurement of the visibility of the grating due to the direct beams may be made. By calculating the fringe visibility for various combinations of path length difference and shear, the fringe visibility corresponding to various values of d may be mapped out. The coherence length of the direct beams may be measured using the Michelson interferometer 800.

The visibility information for the direct interfering beams can be used to choose an exposure window for test exposures. The transferred grating in test wafers may subsequently be measured for period variation, duty cycle variation and height variation over several areas using an atomic force microscope (AFM) or a scanning electron microscope (SEM). An optimal out-of-contact window may be determined from a statistical analysis of the experimental results.

It will be appreciated that the experimental technique for measuring the visibility of the fringes produced by the light need not be restricted to the use of a Michelson interferometer. Other experimental approaches to measuring the fringe visibility include using a Mach Zehnder interferometer and other suitable interferometric techniques.

As noted above, the present invention is applicable to photolithographic methods of transferring a pattern from a phase mask to a substrate. It is believed to be particularly useful for reducing the precision in the thickness of the photoresist and antireflection layers that is needed to obtain high exposures of high contrast. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

I claim:

1. A non-contact method for transferring a pattern from a phase mask to a photoresist layer on a substrate, comprising:
    adjusting a working distance between the phase mask and the photoresist layer so that the phase mask is not in contact with the photoresist layer and that the zero order and minus first order beams produce a primary grating in the photoresist layer and so as to reduce visibility of a secondary grating in the photoresist layer produced by an indirect light beam;
    directing light to expose the photoresist through the phase mask to the photoresist layer so as to produce zero order and minus first order direct light beams, the light being of a wavelength to expose the photoresist.

2. A method as recited in claim 1, wherein the primary grating has a visibility greater than 80%.

3. A method as recited in claim 1, wherein the secondary grating has a visibility less than 20%.

4. A method as recited in claim 1, wherein adjusting the separation distance includes measuring the separation distance between the phase mask and the photoresist layer at one or more positions across the phase mask.

5. A method as recited in claim 1, wherein an adjusted separation distance is in the range 5 $\mu$m–1000 $\mu$m.

6. A method as recited in claim 1, wherein an adjusted separation distance is in the range 5 $\mu$m–30 $\mu$m.

7. A method as recited in claim 1, further comprising generating the light to expose the photoresist as a light beam, conditioning the light beam to form a conditioned light beam, expanding the conditioned light beam to form an expanded light beam and directing the expanded light beam towards the phase mask.

8. A method as recited in claim 1, wherein the phase mask includes a grating pattern to be transferred to the photoresist layer.

9. A method as recited in claim 1, wherein directing light to expose the photoresist includes directing the light towards the phase mask at the Bragg angle.

10. A method as recited in claim 1, further comprising providing an antireflection layer between the substrate and the photoresist layer.

11. A method as recited in claim 1, further comprising providing an antireflection layer on top of the photoresist layer.

12. A method as recited in claim 1, wherein adjusting the working distance includes moving a phase mask holder with respect to a substrate holder.

13. A method as recited in claim 1, wherein adjusting the working distance includes moving a substrate mask holder with respect to a phase mask holder.

14. A method as recited in claim 1, further comprising measuring visibility of fringes formed by the light directed to expose the photoresist to determine a preferred working distance between the phase mask and the photoresist layer, and adjusting the working distance includes adjusting the working distance to the preferred working distance.

15. A device for non-contact transfer of a pattern from a phase mask to a photoresist layer, comprising:
    means for directing light to expose the photoresist through the phase mask to the photoresist layer so as to produce zero order and minus first order direct light beams, the light being of a wavelength to expose the photoresist; and
    means for adjusting a separation distance between the phase mask and the photoresist layer so that the zero order and minus first order beams produce a primary grating in the photoresist layer and so as to reduce visibility of any secondary grating in the photoresist layer produced by one of the direct light beams and an indirect light beam originating from a surface reflection of a direct light beam from a light input surface of the photoresist layer.

16. A non-contact method for transferring a pattern from a phase mask to a photoresist layer on a substrate, comprising:
    adjusting a working distance between the phase mask and the photoresist layer so that the phase mask is not in contact with the photoresist layer; the working distance being greater than the coherence length of an indirect beam and in the range from 5 $\mu$m–1000 $\mu$m; and
    directing light to expose the photoresist through the phase mask to the photoresist layer so as to produce zero order and minus first order direct light beams.

17. A method as recited in claim 16, wherein adjusting the separation distance includes measuring the separation distance between the phase mask and the photoresist layer at one or more positions across the phase mask.

18. A method as recited in claim 16, wherein the working distance is in the range 5 $\mu$m–1000 $\mu$m.

19. A method as recited in claim 16, wherein the working distance is in the range 5 $\mu$m–30 $\mu$m.

20. A method as recited in claim 16, further comprising generating the light to expose the photoresist as a light beam, conditioning the light beam to form a conditioned light beam, expanding the conditioned light beam to form an expanded light beam and directing the expanded light beam towards the phase mask.

21. A method as recited in claim 16, wherein the phase mask includes a grating pattern to be transferred to the photoresist layer.

22. A method as recited in claim 16, wherein the phase mask has an associated Bragg angle, and directing light to expose the photoresist includes directing the light towards the phase mask at the Bragg angle.

23. A method as recited in claim 16, further comprising providing an antireflection layer between the substrate and the photoresist layer.

24. A method as recited in claim 16, further comprising providing an antireflection layer on top of the photoresist layer.

25. A method as recited in claim 16, wherein adjusting the working distance includes moving a phase mask holder with respect to a substrate holder.

26. A method as recited in claim 16, wherein adjusting the working distance includes moving a substrate mask holder with respect to a phase mask holder.

27. A method as recited in claim 16, further comprising measuring visibility of fringes formed by the light directed to expose the photoresist to determine a preferred working distance between the phase mask and the photoresist layer, and adjusting the working distance includes adjusting the working distance to the preferred working distance.

28. An apparatus for near field holography, comprising:
a phase mask holder holding a phase mask;
a substrate holder holding a substrate having a photoresist layer proximate the phase mask;
a light source for delivering light to the phase mask, exposing light from the light source that has passed through the phase mask having a coherence length; and
at least one of the phase mask holder and the substrate holder being adjustable for selecting a separation distance between the substrate holder and the phase mask holder so that the phase mask is not in contact with the photoresist layer and that a first distance, corresponding to a distance traveled by a direct beam between the phase mask and the photoresist layer, is shorter than a second distance traveled by an indirect beam between the phase mask and the photoresist layer, by more than the coherence length of the indirect beam.

29. Apparatus as recited in claim 28, further comprising a phase mask held by the phase mask holder and a substrate held by the substrate holder, the substrate having a photoresist layer proximate, and out of contact with, the phase mask.

30. Apparatus as recited in claim 28, wherein the mechanism for adjusting the separation distance between the substrate holder and the phase mask holder is adjustable so as to produce a working distance ranging from 5 $\mu$m to 30 $\mu$m between the substrate when the substrate in held in the substrate holder and the phase mask when the phase mask is held in the phase mask holder.

31. Apparatus as recited in claim 28, further comprising a distance measuring system disposed to measure a separation distance between the phase mask and the photoresist layer when the phase mask holder holds a phase mask and when the substrate holder holds a substrate having a photoresist layer proximate the phase mask.

32. Apparatus as recited in claim 31, wherein the distance measuring system includes a light source to direct measuring light towards the phase mask and the substrate and a detector unit to detect light fringes formed by measuring light reflected from the phase mask and the substrate.

33. Apparatus as recited in claim 32, wherein the detector unit of the distance measuring system includes a spectrometer to wavelength analyze the reflected light.

34. Apparatus as recited in claim 28, wherein the light source includes a light emitter emitting light, a light conditioning unit to condition the light emitted by the light emitter and produce a conditioned light beam and a beam expanding telescope disposed to expand the conditioned light beam.

35. Apparatus as recited in claim 28, wherein the light conditioning unit includes a filter having a passband of less than about 10 nm.

36. An apparatus for near field holography, comprising:
a phase mask holder;
a substrate holder for holding a substrate having a photoresist layer proximate the phase mask when the phase mask holder holds a phase mask;
a light source for delivering light to the phase mask when the phase mask holder holds a phase mask; and
at least one of the phase mask holder and the substrate holder being adjustable for selecting a separation distance between the substrate holder and the phase mask holder so that, when the phase mask holder holds a phase mask and when the substrate holder holds a substrate having a photoresist layer proximate the phase mask, and not in contact with the phase mask, light from the light source directly incident on the photoresist layer through the phase mask produces substantially no overlapping grating in the photoresist layer with light from the light source indirectly incident on the photoresist layer.

37. Apparatus as recited in claim 36, further comprising a phase mask held by the phase mask holder and a substrate held by the substrate holder, the substrate having a photoresist layer proximate, and out of contact with, the phase mask.

38. Apparatus as recited in claim 36, wherein the mechanism for adjusting the separation distance between the substrate holder and the phase mask holder is adjustable so as to produce a working distance ranging from 5 $\mu$m to 30 $\mu$m between the substrate when the substrate in held in the substrate holder and the phase mask when the phase mask is held in the phase mask holder.

39. Apparatus as recited in claim 36, wherein the mechanism for adjusting the separation distance between the substrate holder and the phase mask holder is adjustable so as to produce a working distance ranging from 5 $\mu$m to 1000 $\mu$m between the substrate when the substrate in held in the substrate holder and the phase mask when the phase mask is held in the phase mask holder.

40. Apparatus as recited in claim 36, further comprising a distance measuring device disposed to measure a separation distance between the phase mask and the photoresist layer when the phase mask holder holds a phase mask and when the substrate holder holds a substrate having a photoresist layer proximate the phase mask.

41. Apparatus as recited in claim 36, wherein the light source includes a light emitter emitting light, a light conditioning unit to condition the light emitted by the light emitter and produce a conditioned light beam and a beam expanding telescope disposed to expand the conditioned light beam.

42. Apparatus as recited in claim 41, wherein the light conditioning unit includes a filter having a passband of less than about 10 nm.

43. Apparatus as recited in claim 37, further comprising a distance measuring device to measure distance between the phase mask and the photoresist layer on the substrate.

44. Apparatus as recited in claim 43, wherein the distance measuring device includes a light source to direct measuring light towards the phase mask and the substrate and a detector to detect light fringes formed by the phase mask and the substrate.

45. A non-contact method for transferring a pattern from a phase mask to a photoresist layer on a substrate, comprising:

adjusting a working distance between the phase mask and the photoresist layer so that the phase mask is not in contact with the photoresist layer; the working distance being greater than the coherence length of an indirect beam;

directing light to expose the photoresist through the phase mask to the photoresist layer so as to produce zero order and minus first order direct light beams; and measuring visibility of fringes formed by the light directed to expose the photoresist to determine a preferred working distance between the phase mask and the photoresist layer;

wherein adjusting the working distance includes adjusting the working distance to the preferred working distance.

* * * * *

UNITED STATES PATENT AND TRADEMARK OFFICE
CERTIFICATE OF CORRECTION

PATENT NO.    : 6,693,701 B2
DATED         : February 17, 2004
INVENTOR(S)   : Poul-Erik Hansen et al.

It is certified that error appears in the above-identified patent and that said Letters Patent is hereby corrected as shown below:

Title page,
Item [75], Inventor, please add -- Per Eld Ibsen, Valby (DK) --.

Signed and Sealed this

Twenty-third Day of November, 2004

JON W. DUDAS
*Director of the United States Patent and Trademark Office*